United States Patent [19]

Kadota

[11] 4,447,891
[45] May 8, 1984

[54] SIMULTANEOUS READ-WRITE IGFET MEMORY CELL

[75] Inventor: Hiroshi Kadota, Toyonaka, Japan

[73] Assignee: Matsushita Electric Industrial Co., Ltd., Osaka, Japan

[21] Appl. No.: 304,942

[22] Filed: Sep. 23, 1981

[30] Foreign Application Priority Data

Sep. 26, 1980 [JP] Japan ................. 55-134897

[51] Int. Cl.³ ................. G11C 7/00; G11C 11/40
[52] U.S. Cl. ................. 365/154; 365/189; 365/190
[58] Field of Search ................. 365/154, 190, 156, 189

[56] References Cited

PUBLICATIONS

IBM Technical Disclosure Bulletin vol. 23, No. 7A, Dec. 1980, p. 2822, Multi-Port Asymmetrical Memory Cell, Joy et al.
IBM Technical Disclosure Bulletin vol. 17, No. 11, Apr. 1975, p. 3337, IGFET Address Powered Schmidt Storage Cell, Sonoda.
IBM Technical Disclosure Bulletin vol. 17, No. 11, Apr. 1975, pp. 3338-3339, Low-Power FET Storage Cell, Linton et al.
IBM Technical Disclosure Bulletin vol. 22, No. 10, Mar. 1980, pp. 4555-4556 "Low Voltage Memory Cell" D. B. Fields.
IBM Technical Disclosure Bulletin vol. 22, No. 10, Mar. 1980, pp. 4553-4554 "Multi-Port Array Cell" R. T. Dennison et al.

Primary Examiner—George G. Stellar
Attorney, Agent, or Firm—Burgess, Ryan & Wayne

[57] ABSTRACT

In a random-access memory of the type comprising an array of memory cells each comprising two cross-coupled inverters, each memory cell is connected to a first address line in a column direction exclusively used for a write operation, a second address line in a column direction used exclusively for a read operation, two first complementary data lines in a row direction used exclusively for a write operation and a second data line in a row direction used exclusively for a read operation. The two complementary data lines are connected through gate elements to their corresponding complementary input-output nodes, respectively, in each cell and these gate elements are controlled by the first address line used exclusively for a write operation and the data line used exclusively for a read operation is connected to one of the complementary nodes through a gate element which in turn is controlled by the data line used exclusively for a read operation. The complementary data lines are connected to a drive circuit which delivers information to be stored while the data line used exclusively for a read operation is connected to a sense amplifier. Since the read and write operations can be carried out simultaneously but independently of each other, erratic operations can be avoided regardless of the timing relationships between the write and read operations.

2 Claims, 13 Drawing Figures

SIMULTANEOUS READ-WRITE IGFET MEMORY CELL

BACKGROUND OF THE INVENTION

The present invention relates to a random-access memory (to be referred to as "RAM" hereinafter in this specification).

When a particular address selects one memory cell in a RAM device, information is stored in that cell or the contents therein are read out, but it is impossible to carry out simultaneous read and write operations. Furthermore, it is prohibited to read immediately after a write operation because an erratic operation results.

SUMMARY OF THE INVENTION

The present invention has for its object to provide a RAM in which memory cells, address lines and data lines are so arrayed and interconnected that write and read operations can be accomplished simultaneously or in any desired timing relationship and independently of each other.

According to the present invention, in a RAM of the type comprising an array of memory cells each of which comprises two cross-coupled inverters, each memory cell is connected to a first address line in a column direction used exclusively for a write operation, a second address line in a column direction used exclusively for a read operation, two complementary data lines in a row direction used exclusively for a write operation and a second data line in a row direction exclusively used for a read operation. The complementary data lines exclusively used for a write operation are connected to their corresponding complementary input-output nodes, respectively, in each cell through gate elements which are controlled by the first address line. One of the complementary input-output nodes and the second data line exclusively used for a read operation are interconnected through a gate element which in turn is controlled by the second data line. The data lines used exclusively for a write operation are connected to a driver and the second data line used exclusively for a read operation is connected to a sense amplifier. Thus, the read and write operations can be accomplished independently of each other and in any desired timing relationship without causing any erratic operation.

BRIEF DESCRIPTION OF THE DRAWINGS

The same reference letters and numerals are used to designate similar parts throughout the figures.

DETAILED DESCRIPTION OF THE PRIOR ART

Figure 1:
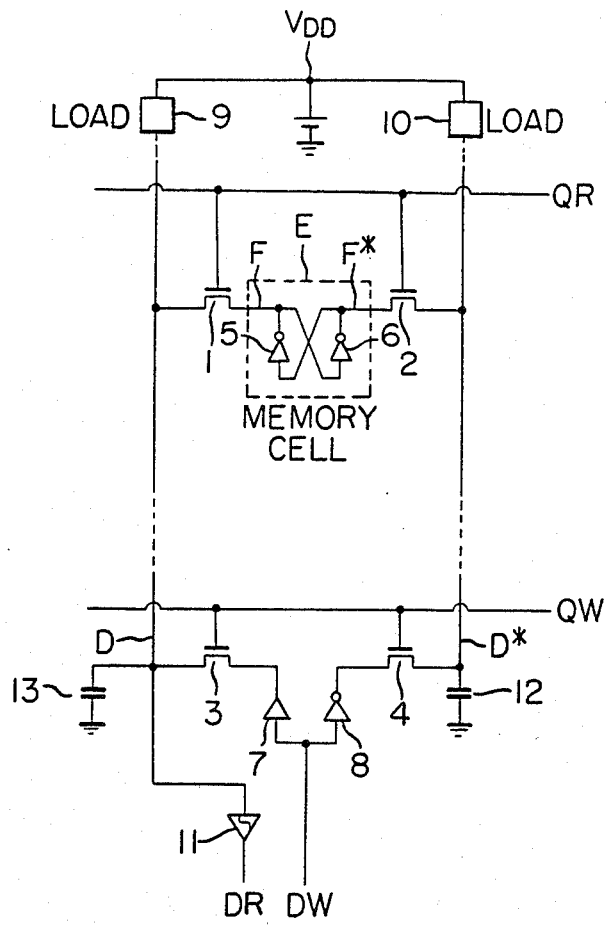
FIG. 1 is a circuit diagram of a prior art RAM.

In FIG. 1 is shown an equivalent circuit of a prior art RAM. E denotes one of the memory cells arranged in a matrix array; QR, a row address line; D and D*, complementary column data lines; F and F*, complementary input-output nodes in the memory cell E; QW, a write control line; DW, a write or data-in line; and DR, data-out line. Reference numerals 1, 2, 3 and 4, gating transistors. When the address line QR or the write control line QW is at the state "1", the source and drains of the transistors 1 and 2 or 3 and 4 are electrically connected through their internal resistances but when the address line QR or the write control line QW is at the state "0", the source and drain of each transistor are disconnected. Two inverters 5 and 6 are connected in the form of a loop so that positive feedback can be attained and a flip-flop is provided. When a specific address signal specifies this memory cell E, the address line QR changes to the state "1" and the input-output node F and the data line D are interconnected through the internal resistance in the transistor 1 while the input-output node F* and the data line D* are interconnected through the internal resistance of the transistor 2. As a result, depending upon the potentials of the column data lines D and D*, the potentials at the input-output nodes F and F* (that is, the condition of the memory cell E) vary. For instance, in the case of writing, the write control line QW is in the state "1" and the transistors 3 and 4 are turned on. As a consequence, data [DW] to be stored (bracket [ ] represents the contents or potential) is applied as [DW] and [$\overline{DW}$] to the column data lines D and D* through forward and inverted drive circuits 7 and 8, respectively. That is, one of the column data lines D and D* remains at the state "1" while the other, at the state "0". In this case, regardless of the condition of the memory cell E immediately before the "write" operation is started, the write operation in the directions [D] to [F] and [D*] to [F*] is initiated.

In the case of reading, the write control line QW is at the "OFF" state and the potentials of the column data lines D and D*, immediately before the read operation is started, are connected through loads (for instance, resistors) 9 and 10 to a positive power supply $V_{DD}$ so that, immediately before the row address line QR changes to the "ON" state, [D] and [D*] are at the potentials representative or almost representative of the state "1". When the row address line QR changes to the state "1" in response to the address signal that is, when the read operation is started, the transistors 1 and 2 are turned on, so that the data are transferred in the directions [F] to [D] and [F*] to [D*], which are opposite to the directions in the case of writing. In the case of the reading, the "0" state potentials of the data lines D and D* are higher than the normal "0" state potential and are between the normal "0" state potential and the "1" state potential. (See FIG. 2B, the potential on the line D being indicated by [*].) The data is converted through a discrimination circuit 11 into the normal "1" or "0" state potential and then delivered to the data-out line DR.

Figure 2A:
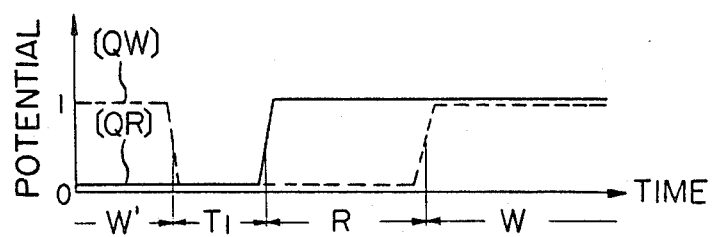
FIGS. 2A, 2B, and 2C illustrate variations of potential during read and write operations without causing erratic operation.
Figure 2B:
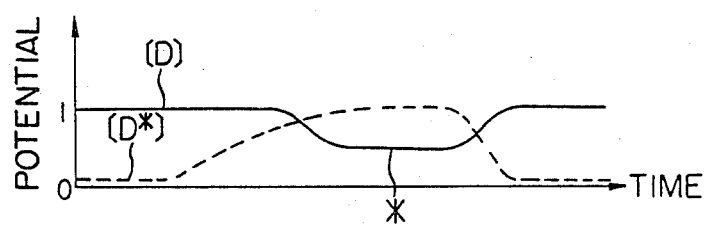
Figure 2C:
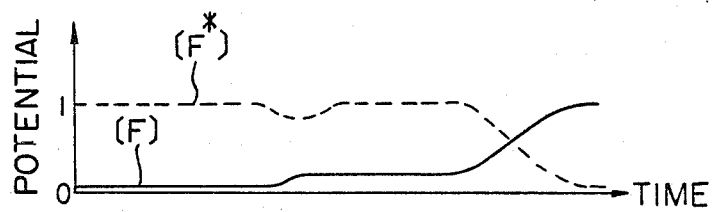

Variations of potential level on the signal lines during the read and write operations are shown in FIGS. 2A to 2C, in which the potential is plotted along the ordinate while the time, along the abscissa. FIG. 2A shows the potentials on the row address line QR and the write control line QW. Time W' indicates a time interval during which data are stored into another memory cell E' (not shown) and connected to the data lines D and D*. During this time period, [F'] in the memory cell E' is at the state "1". Passing $T_1$ after W', the row address line QR changes to the state "1" and the transistors 1 and 2 are turned on so that the memory cell E is accessed. A time interval R indicates this state. If QW changes to the state "0" and the transistors 3 and 4 are turned off at the end of W', the column data line D* which has been at the "0" state potential rises to the "1" state potential with a time constant which is dependent upon the load 10 and the floating capacitance 12 of the data line D* (the floating capacitance of the column data line D being indicated by 13). After D* has changed to the state "1" passing $T_1$ after the completion of the storage of data into the memory cell E', the read cycle or operation is started. For instance, even if the potentials on [D] and [D*] are opposite to those of [F] and [F*], the read cycle is accomplished without any error. However, during the time interval R, D will not drop to the normal "0" state potential as indicated by *, but, as described previously, the discrimination circuit 11 can discriminate such potential drop as the drop to the "0" state potential and provides the normal "0" state potential. As a result, no problem arises.

During a time interval W, the write control line QW changes to the state "1" so that data are stored into the memory cell E. In this case, as shown in FIG. 2C, the inverted data are stored.

Figure 3A:
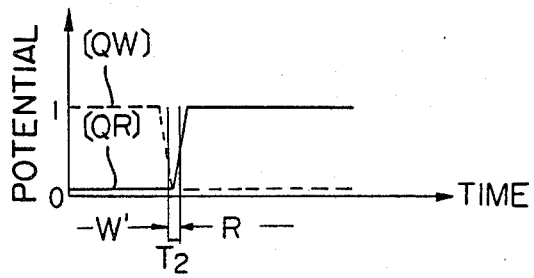
FIGS. 3A, 3B, and 3C illustrate variations of potential during read and write operations with erratic operation.
Figure 3B:
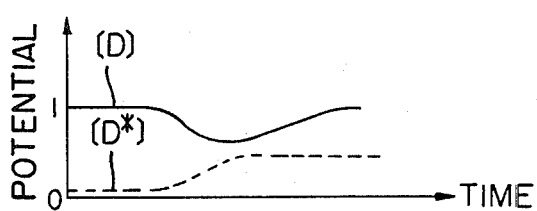
Figure 3C:
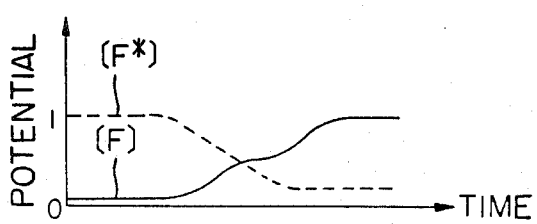

However, if, as shown in FIG. 3A, the time interval is reduced to $T_2$ from $T_1$, the read cycle R is started before the potential on the column data line D* has risen to a predetermined level. As the result, the conditions of the [D] and [D*] are stored into the memory cell E and then delivered to the data-out line DR as shown in FIGS. 3A to 3C. FIG. 3B shows the variations in potential at the [D] and [D*] and FIG. 3C shows the variations in potential at [F] and [F*] in the memory cell E. It is the read cycle not the write cycle, but the potentials of [F] and [F*] are reversed because of the influence from the potentials of [D] and [D*].

In read RAMs, the time interval $T_1$ from 15 to 50 nanoseconds is in general provided in order to prevent erratic operations. However, in the case of small-sized RAMs in microcomputers or when RAMs are used as a register group, it is sometimes needed to start the "read" cycle immediately after the "write" cycle in order to shorten the operation or execution time. In an extreme case, the operation or execution time will be much shortened if the "read" and "write" cycles can be accomplished simultaneously and consequently the design of circuits and systems for microcomputers will be much facilitated. Thus, the selection of the time interval $T_1$ is very important.

DESCRIPTION OF THE PREFERRED EMBODIMENTS

The present invention solves the above and other problems encountered in the prior art RAM and will be described in detail with the accompanying drawings.

Figure 4:
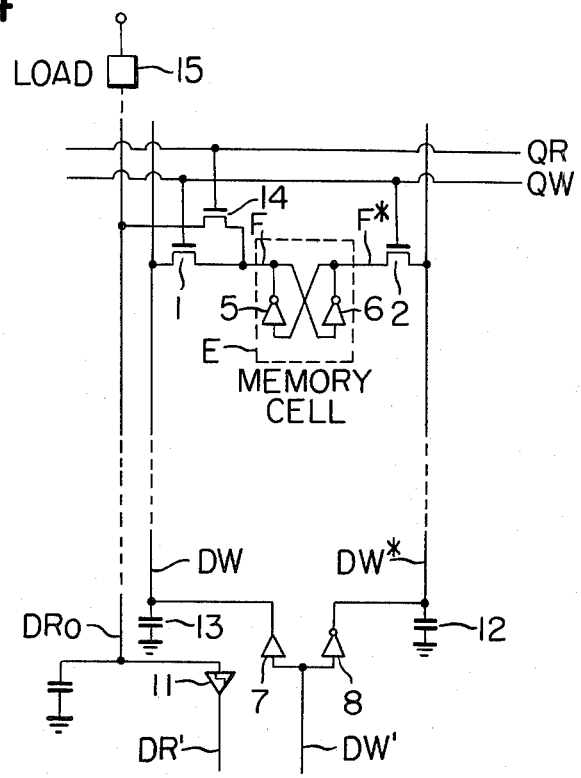
FIG. 4 is a circuit diagram of a first embodiment of the present invention.

In FIG. 4 is shown a first embodiment that is, a static RAM of the present invention. The memory cell E includes a flip-flop comprising conventional inverters 5 and 6 each comprising a MOSFET and a load such as a MOSFET or a resistor. More specifically, the drain or output terminal of the MOSFET of one of the inverters 5 and 6 is connected to the gate or input terminal of the MOSFET of the other inverter. The complementary input-output nodes F and F* are connected through the transistors 1 and 2, respectively, to the data lines DW and DW*, respectively. Opposed to the prior art RAM as shown in FIG. 1 in which the data lines are connected to the drive circuits 7 and 8 through the transistors 3 and 4, the data lines DW and DW* are directly connected to the drive circuits 7 and 8. A gating transistor 14 is connected to the node F and to a data line $DR_o$. The data line $DR_o$ is connected between a load 15 and the discrimination circuit 11.

The transistors 1 and 2 are controlled by the address line QW and the transistor 14 is controlled by the address line QR.

The differences between the prior art RAM as shown in FIG. 1 and the first embodiment of the present invention (FIG. 4) may be summarized as follows:

(1) Data lines exclusively used for "write" and "read" operations, respectively, are provided.
(2) As a result, the address line QW exclusively used for a "write" operation and the address line QR used exclusive for a "read" operation are provided, these address lines being used to control the gates between the data lines and the memory cell E.

In addition to these signal lines, the data-out line DR' and the data-in line DW' are provided.

In other words, the first embodiment of the present invention is structurally distinguished over the prior art by the provision of the separate data and address lines as described above.

Since the address line QR, the data line $DR_o$ and the transistor 14 are additionally connected to the memory cell E, the space of each memory cell in the integrated circuit is greater than that of the prior art memory cell, but such minor disadvantage cen be fully compensated for by the remarkable improvement in characteristics to be described below.

Since the separate "write" data lines DW and DW* and "read" data line $DR_o$ are provided, the change in contents in the memory cell during the "read" cycle can be avoided. As described previously with reference to FIG. 1, the problem is caused because at the instant when the transistor 1 has been turned on, the potential on the column data line D is lower than the potential prior to the "write" cycle, so that the storage of data in the direction [D] to [F] results. However, according to the present invention, the data line $DR_o$ is used exclusively for the "read" cycle and its potential drops only to the intermediate potential as indicated by * in FIG. 2B or FIG. 5C. This potential is higher than a threshold potential needed to store data into the memory cell, so that even if [$DR_o$] is at the intermediate "0" state potential immediately before the transistor 14 is turned on, it is transmitted through the transistor 14 to the data line $DR_o$ if [F] is at the state "1". As a result, the data line $DR_o$ remains at the "1" state potential.

Figure 5A:
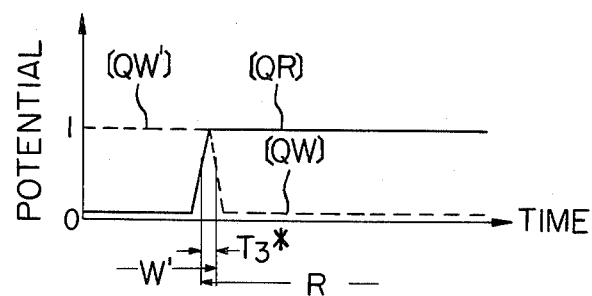
FIGS. 5A, 5B, 5C, and 5D illustrate variations of potential during read and write operations of the invention.
Figure 5B:
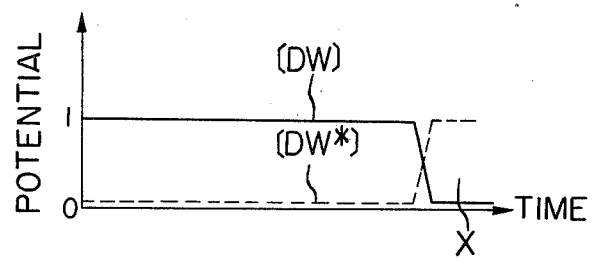
Figure 5C:
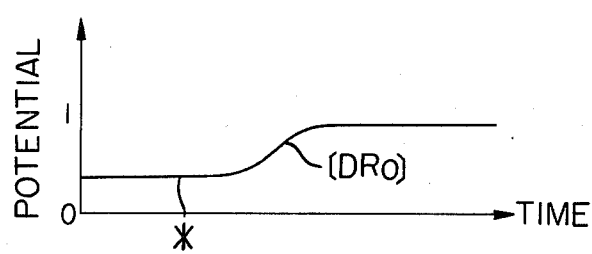
Figure 5D:
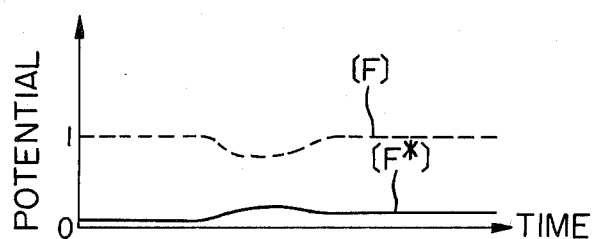

Potential variations at various points are shown in FIGS. 5A to 5D. In FIG. 5A, [QW'] and [QR] denote the address signals. The "write" cycle W' for another memory cell E' and the "read" cycle R of the memory cell E are overlapped for $T_3$. During this interval, the potential [QW] of the "write" address signal QW is maintained at the "0" state potential. As is apparent from the variations in potential of [F] and [F*] in the memory cell E as shown in FIG. 5D, before the memory cell E is specified by the address line QR, [F] is at the state "1" potential and [F*] at the state "0" potential. After the memory cell E has been specified (that is, during the "read" cycle), the data line $DR_o$ is charged, so that the potentials of [F] and [F*] approach to the level intermediate to the state "1" potential and the state "0" potential, but they are not reversed so that the state prior to the specification of the memory cell E can be maintained. FIG. 5C shows the variation in potential of the data line DR and it is seen that the potential at the node "F⇌" is read out even when the data line $DR_o$ is still at the intermediate "0" state potential. The potential $DR_o$ gradually rises to the state "1" potential.

FIG. 5B shows the variations in potential on the data lines DW and DW*. Since the write address QW to the memory cell E is at the "0" state potential, the potentials at the input-output nodes F and F* and on the data line DR remain unaffected even when the [DW] and [DW*] are reversed as indicated at X in FIG. 5B.

As described above, according to the present invention, while data is being stored into one memory cell, data can be "read" out from another memory cell independently of the data-out operation from said one memory cell. In the prior art RAM as shown in FIG. 1, the data lines D and D* are charged through the transistors 3 and 4 only after [QW] changes to the state "1" and the transistors 3 and 4 are turned on, so that some time interval is needed for [QW] to change to the state "1" after data have appeared on the data line DW. According to the present invention, however, the transistors 3 and 4 are eliminated and as soon as data have arrived at the data line DW, the data lines DW and DW* are charged and [DW] and [DW*] are almost at the normal potential levels when [QW] changes to the state "1" so that the data in the memory cell can be changed almost without no delay.

The first embodiment is shown in FIG. 4 as having only one read data line, but it is to be understood that as with the conventional RAM, a complementary data line DR* may be extended through a gate element from the node F* so as to be differentially fed into a detector, thereby improving the detection sensitivity.

Figure 6:
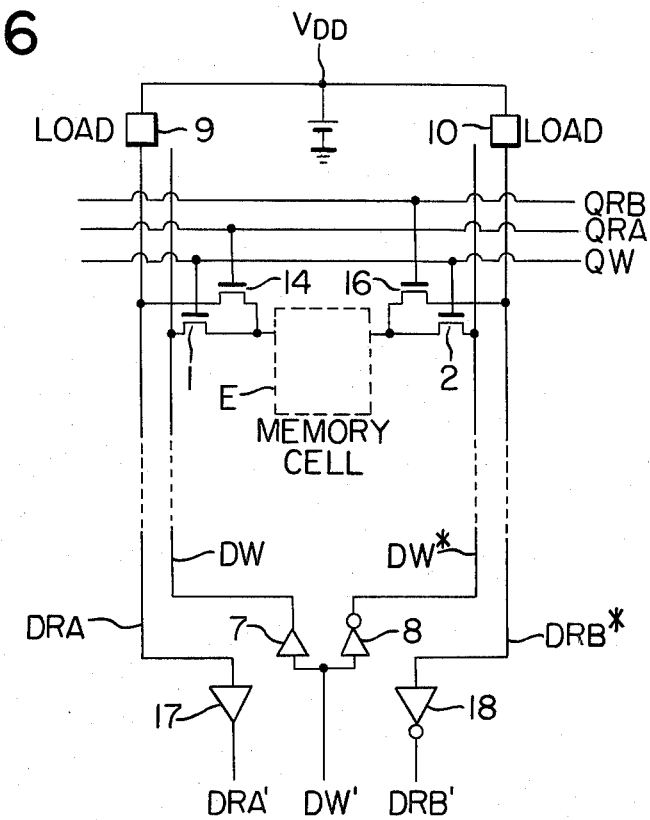
FIG. 6 is a circuit diagram of a second embodiment of the present invention.

In FIG. 6 is shown a second embodiment of the present invention which is substantially similar in construction to the first embodiment shown in FIG. 4 except that a "read" address line QRB, a data line DRB*, gate 16 and a discriminator 18 are provided so that the write operation into one memory cell and the read operations from two memory cells can be carried out simultaneously.

Reference numeral 17 denotes a discriminator.

With the conventional microcomputer, very frequently two data $\alpha$ and $\beta$ (each consisting of one word) are simultaneously read out and operated (for instance, $\gamma = \alpha + \beta$). The result $\gamma$ is stored into a memory cell and immediately thereafter further memory cells are specified to read out further data. To this end, the second embodiment of the present invention is very satisfactory and the faster execution time hitherto unattainable by the conventional RAM can be obtained.

What is claimed is:

1. A circuit for a unit cell of a random-access memory coupled to first and second complementary write-only data lines, a read-only data line, a write-only address line and a read-only address line, comprising:
    a bistable circuit comprising two cross-coupled insulated-gate field-effect transistors, said bistable circuit having first and second complementary input/output nodes;
    write data line switching means comprising first and second insulated-gate field-effect transistors,
    said first transistor having main electrodes connected between said first input/output node and said first write-only data line, and a gate electrode connected to said write-only address line,
    said second transistor having main electrodes connected between said second input/output node and said second write-only data line, and a gate electrode connected to said write-only address line;
    a driver circuit for supplying write data to said write-only data lines;
    a load means and a detector circuit connected to said read-only data line;
    means for maintaining said read-only data line at a potential higher than a threshold potential below which data can be stored in said bistable circuit, so that data cannot be written into said unit cell via said read-only data line;
    read data line switching means comprising a third insulated-gate field-effect transistor having main electrodes connected between said first input/output node and said read-only data line, and a gate electrode connected to said read-only address line.

2. The circuit according to claim 1, further comprising:
    a second read-only data line;
    a second read-only address line;
    a second load means and a second detector circuit connected to said second read-only data line;
    said read data line switching means further comprising a fourth insulated-gate field-effect transistor having main electrodes connected between said second input/output node and said second read-only data line, and a gate electrode connected to said second read-only address line.

* * * * *